US008806420B2

(12) United States Patent
Chan et al.

(10) Patent No.: US 8,806,420 B2
(45) Date of Patent: Aug. 12, 2014

(54) IN-GRID ON-DEVICE DECOUPLING FOR BGA

(75) Inventors: Alex Chan, Nepean (CA); Paul James Brown, Wakefield (CA)

(73) Assignee: Alcatel Lucent, Boulogne Billancourt (FR)

( * ) Notice: Subject to any disclaimer, the term of this patent is extended or adjusted under 35 U.S.C. 154(b) by 357 days.

(21) Appl. No.: 13/231,587

(22) Filed: Sep. 13, 2011

(65) Prior Publication Data

US 2013/0062762 A1    Mar. 14, 2013

(51) Int. Cl.
*G06F 17/50*    (2006.01)
*H01L 23/498*    (2006.01)

(52) U.S. Cl.
USPC ............... 716/137; 716/118; 257/738

(58) Field of Classification Search
CPC ............ G06F 17/5068; G06F 17/5072; G06F 17/5077; G06F 17/5081; G06F 17/5036; H01L 2924/01079; H01L 2924/01029; H01L 2924/01078
USPC ................... 716/118, 137; 257/738
See application file for complete search history.

(56) References Cited

U.S. PATENT DOCUMENTS

| 7,323,787 | B2 | 1/2008 | Chan et al. |
| 7,602,615 | B2 | 10/2009 | Chan et al. |
| 7,738,259 | B2 | 6/2010 | Chan et al. |
| 8,426,980 | B2 * | 4/2013 | Su et al. ................. 257/777 |
| 2002/0011859 | A1 * | 1/2002 | Smith et al. ............. 324/755 |
| 2005/0162839 | A1 * | 7/2005 | Chan et al. ............. 361/782 |
| 2008/0251906 | A1 | 10/2008 | Eaton et al. |
| 2009/0213104 | A1 * | 8/2009 | Yaguma et al. ........... 345/211 |
| 2010/0019374 | A1 | 1/2010 | Hundt |
| 2011/0156264 | A1 | 6/2011 | Machida |

OTHER PUBLICATIONS

Unpublished U.S. Appl. No. 12/984,240.
International Search Report and Written Opinion in corresponding application No. PCT/CA2012/050618, mailed Nov. 30, 2012.

* cited by examiner

*Primary Examiner* — Vuthe Siek
*Assistant Examiner* — Magid Dimyan
(74) *Attorney, Agent, or Firm* — Kramer & Amado, P.C.

(57) ABSTRACT

Embodiments of the invention place surface-mount such as decoupling capacitors, resistors or other devices directly on the underside of a ball grid array (BGA) electronic integrated circuit (EIC) package, between BGA pads.

17 Claims, 3 Drawing Sheets

IN-GRID ON-DEVICE DECOUPLING FOR BGA

CROSS REFERENCE TO RELATED APPLICATIONS

The present application is related to co-pending U.S. patent application entitled "DE-POP ON-DEVICE DECOUPLING FOR BGA" (Chan et al.) filed concurrently herewith, the entire content of which is incorporated herein by reference.

FIELD OF THE INVENTION

The invention is directed to Ball Grid Array (BGA) packages for use on electronic circuit cards and more specifically, improved decoupling arrangements.

BACKGROUND OF THE INVENTION

As electronic integrated circuit (EIC) packages such as Ball Grid Array (BGA) packages increase in density, in interface connection density, and in clock speed, the requirements for electrically decoupling a BGA device become more stringent. It is advantageous to place these coupling capacitors as close to the BGA pads as possible. Typical placement of surface-mount decoupling capacitors is adjacent to the BGA device on the same side of the electronic circuit board or on the opposite side of the electronic circuit board, connected by vies through the circuit board. Both of these techniques can introduce parasitic inductance due to the length of the vias and/or the routing leads.

Therefore, improvement to decoupling techniques for BGA devices is highly desirable.

SUMMARY OF THE INVENTION

Embodiments of the invention place surface-mount decoupling capacitors or other surface-mount devices directly on the underside of an electronic integrated circuit (EIC) package, between ball grid array (BGA) pads.

Some embodiments of the invention provide an electronic integrated circuit (EIC) package comprising: an EIC substrate; an array of ball grid array (BGA) pads on a first side of the EIC substrate, arranged in a grid pattern of rows and columns; and contact pads on the first side of the EIC substrate between the BGA pads to accommodate electrical connection of a surface mount device.

In some embodiments the contact pads comprise at least two adjacent contact pads.

In some embodiments each contact pad is connected to an adjacent BGA pad by a conductor on the first side of the EIC substrate.

In some embodiments the surface-mount device comprises a two-port device.

In some embodiments the surface-mount device comprises a decoupling capacitor.

In some embodiments the surface-mount device is selected from the set of: capacitor, resistor, inductor, diode, transistor, capacitor array, and resistor-capacitor circuit.

In some embodiments the BGA grid comprises a pitch of between about 0.8 mm×0.8 mm and about 1.27 mm×1.27 mm.

In some embodiments the BGA grid comprises an irregular pitch.

Other embodiments of the invention provide a computer-aided design tool for accommodating a surface-mount two-port device on a first surface of a ball grid array (BGA) electronic integrated circuit (EIC) package, the tool comprising: a design tool mode to identify, in an EIC configuration of BGA pads in a grid pattern on the first side of the EIC package, at least one contact pad pair for forming directly on the first surface and between the BGA pads, the pad pair for direct mounting of and connection to the two port device.

BRIEF DESCRIPTION OF THE DRAWINGS

Some embodiments of apparatus and/or methods in accordance with embodiments of the present invention are now described, by way of example only, and with reference to the accompanying drawings in which.

In the figures, like features are denoted by like reference characters.

DETAILED DESCRIPTION

Figure 1A:
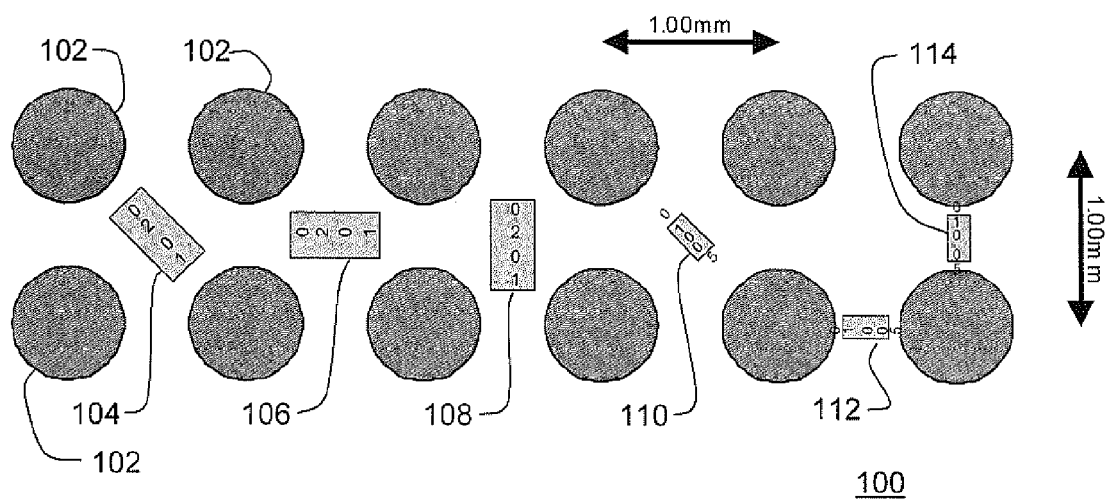
FIG. 1A illustrates a layout of surface mount devices within a BGA grid according to embodiments of the invention.
Figure 1B:
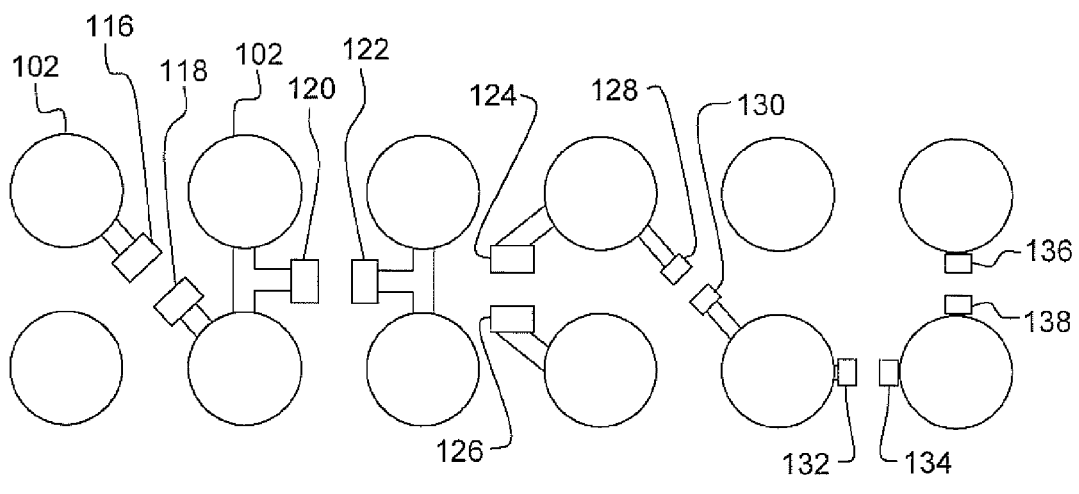
FIG. 1B illustrates contact pad placement according to embodiments of FIG. 1A.

FIG. 1A illustrates a layout of surface mount decoupling capacitors on a bottom surface of an electronic integrated circuit (EIC) package within a BGA grid. BGA pads 102 are laid out in a grid pattern on a 1.00 mm×1.00 mm pitch. Capacitors 104, 106, 108 in a standard '0201' surface-mount package (0.020"×0.010") and capacitors 110, 112, 114 in a standard '01005' surface-mount package (0.010"×0.005") are located between BGA pads 102. Capacitors 104, 106, 108 in '0201' packages or smaller can fit between diagonally adjacent BGA pads in various orientations. Capacitors 112, 114 in '01005' packages or smaller can also fit between adjacent BGA pads. With reference to FIG. 1B, capacitor 104 is mounted to surface-mount pads 116, 118 which are connected to diagonally adjacent BGA pads. Similarly, capacitor 106 is mounted to pads 120 and 122, capacitor 108 is mounted to pads 124 and 126, capacitor 110 is mounted to pads 128 and 130, capacitor 112 is mounted to pads 132 and 134, and capacitor 114 is mounted to pads 136 and 138. Other types of surface-mount devices can be mounted on the underside of a BGA EIC package, including two-port devices such as capacitors, resistors, diodes or three-port devices such as transistors in packages of comparable size.

Figure 2:
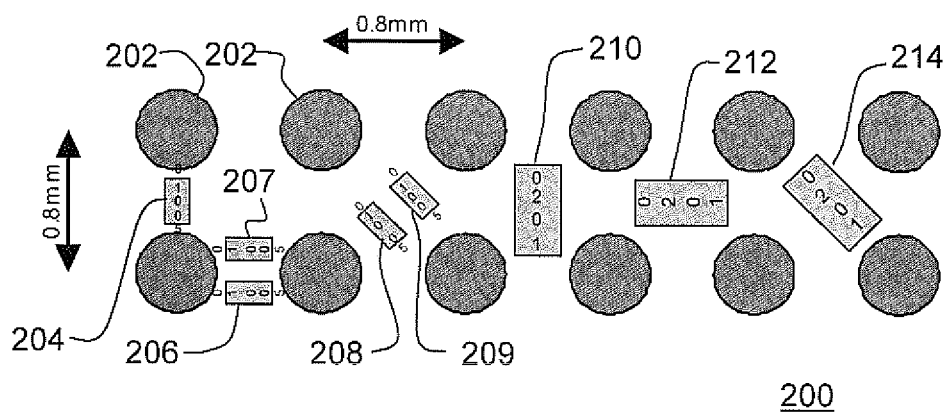
FIG. 2 illustrates a layout of surface mount devices within a BGA grid on an EIC substrate according to other embodiments of the invention.

FIG. 2 illustrates a layout of surface-mount devices on an EIC substrate between BGA pads 202 having a BGA grid pitch of 0.80 mm×0.80 mm. Surface mount devices 210, 212, 214 are in '0201' packages and surface-mount devices 204, 206, 208 are in '01005' packages. Multiple devices 206 and 207 or 208 and 209 can fit within the available space between BGA pads. The multiple devices can be different types. For example, device 206 could be a capacitor and device 207 could be a resistor. As space permits, small surface mount devices can be mounted on BGA packages having different pitch such as 1.27 mm×1.27 mm, 1.00 mm×1.00 mm, or 0.8 mm×0.8 mm as well as on BGA packages having an irregular pitch where longitudinal rows have a different pitch than lateral rows such as for example 0.8 mm×1.0 mm.

Figure 3A:
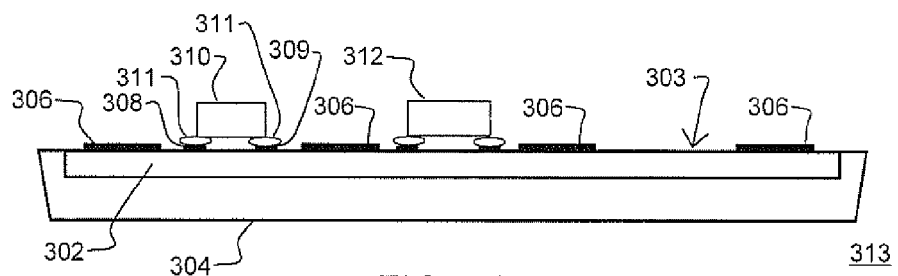
FIG. 3A illustrates placement of surface mount devices on an EIC substrate according to an embodiment of the invention.
Figure 3B:
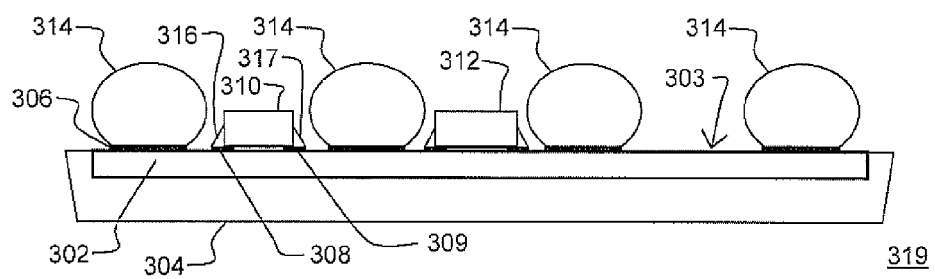
FIG. 3B illustrates placement of surface mount devices between BGA solder balls on an EIC substrate according to an embodiment of the invention.
Figure 3C:
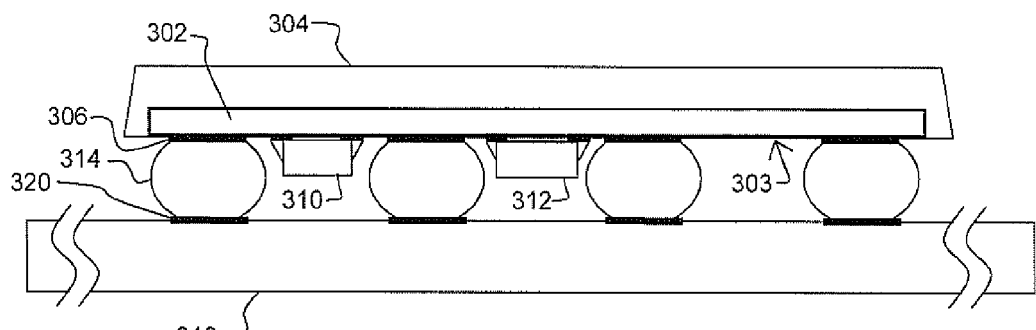
FIG. 3C illustrates placement of an EIC device on a printed circuit board according to an embodiment of the invention.

FIGS. 3A, 3B, 3C illustrate placement of surface-mount devices on an EIC substrate relative to BGA solder spheres and an electronic printed circuit board. The EIC has a substrate 302 and cover or overmold 304 to protect the integrated circuit. On a first surface 303 of substrate 302, are BGA pads 306 arranged in a grid pattern. Contact pads 308, 309 to accommodate surface-mount device 310 are connected to BGA pads 306 as discussed previously.

Surface-mount component 310 is placed on surface-mount pads 308, 309 which have been previously prepared with solder paste 311. Surface-mount device 310 can be held in position with the tacky solder paste 311 on the surface mount pads and/or by adhesive between the body of device 310 and the surface 303. Additional surface mount devices 312 are handled similarly to device 310. BGA solder balls (spheres) 314 are applied onto BGA pads 306. The balls 314 can be held in place by tacky flux as is well known in the art. The EIC package assembly 313 with surface mount devices 310, 312 and solder balls 314 is then reflow-soldered to form an electrical and mechanical bond between surface-mount device 310 and pads 308, 309 and between BGA solder balls 314 and BGA pads 306. Solder paste 311 reflows to form solder fillets 316, 317.

EIC package assembly 319 with solder balls 314 and with devices 310, 312 can then be operationally tested as a unit to verify operation of the EIC in conjunction with devices 310, 312. Devices 310, 312 and solder fillets 316, 317 can also be easily visually inspected at this stage. Advantageously, it is easier to address any problems with the surface-mount components 310, 312 then after the EIC is mounted on a printed circuit board.

With reference to FIG. 3C, EIC package assembly 319 can then be mounted on a printed circuit board 318 and reflow soldered to bond solder balls 314 to BGA solder pads 320 on printed circuit board 318.

Figure 4:
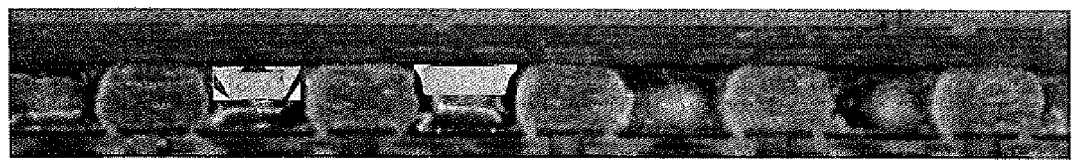
FIG. 4 illustrates a photographic representation of placement of an EIC device on a printed circuit board according to the embodiment of FIG. 3C.

FIG. 4 illustrates a photographic representation of placement of an EIC device having surface-mounted devices onto a printed circuit board according to the embodiment of FIG. 3C.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

It should be appreciated by those skilled in the art that any block diagrams herein represent conceptual views of illustrative circuitry embodying the principles of the invention. Numerous modifications, variations and adaptations may be made to the embodiment of the invention described above without departing from the scope of the invention, which is defined in the claims.

What is claimed is:

1. An electronic integrated circuit (EIC) package comprising:
   an EIC substrate;
   an array of ball grid array (BGA) pads on a first side of said EIC substrate, wherein the BGA pads are arranged in a grid pattern of rows and columns; and contact pads on said first side of said EIC substrate between said BGA pads to accommodate electrical connection of a surface-mount device, wherein the surface-mount device occupies a location between diagonally adjacent BGA pads that is not aligned with any rows and columns in the grid pattern.

2. The EIC package of claim 1, wherein said contact pads comprise at least two adjacent contact pads.

3. The EIC package of claim 2, wherein each said contact pad is connected to an adjacent BGA pad by a conductor on said first side of said EIC substrate.

4. The EIC package of claim 1, wherein said surface-mount device comprises a two-port device.

5. The EIC package of claim 4, wherein said surface-mount device comprises a decoupling capacitor.

6. The EIC package of claim 1, wherein said surface-mount device is selected from a set of a capacitor, a resistor, an inductor, a diode, a transistor, a capacitor array, and a resistor-capacitor circuit.

7. The EIC package of claim 1, wherein said BGA grid comprises a pitch of between about 0.8 mm×0.8 mm and about 1.27 mm×1.27 mm.

8. The EIC package of claim 7, wherein said BGA grid comprises an irregular pitch.

9. The EIC package of claim 1, wherein multiple devices fit in the location between the adjacent BGA pads.

10. The EIC package of claim 9, wherein the multiple devices comprise both a capacitor and a resistor.

11. A computer-aided design tool for accommodating a surface-mount device on a first side of a ball grid array (BGA) electronic integrated circuit (EIC) package, said computer-aided design tool comprising:
   a device configured to identify, in an EIC configuration of BGA pads in a grid pattern on said first side of said EIC package, at least two contact pads for forming directly on said first side and between said BGA pads, said contact pads for direct mounting of and connection to said surface-mount device, wherein the surface-mount device occupies a location between diagonally adjacent BGA pads that is not aligned with any rows and columns in the grid pattern.

12. The computer-aided design tool of claim 11, wherein each said contact pad is connected to an adjacent BGA pad by a conductor on said first side of said EIC package.

13. The computer-aided design tool of claim 11, wherein said surface-mount device comprises a two-port device.

14. The computer-aided design tool of claim 11, wherein said surface-mount device comprises a decoupling capacitor.

15. The computer-aided design tool of claim 11, wherein said surface-mount device is selected from a set of a capacitor, a resistor, an inductor, a diode, a transistor, a capacitor array, and a resistor-capacitor circuit.

16. The computer-aided design tool of claim 11, wherein said BGA grid comprises a pitch of between about 0.8 mm×0.8 mm and about 1.27 mm×1.27 mm.

17. The computer-aided design tool of claim 16, wherein said BGA grid comprises an irregular pitch.

* * * * *